US007149442B2

(12) United States Patent
Ushijima et al.

(10) Patent No.: US 7,149,442 B2
(45) Date of Patent: Dec. 12, 2006

(54) ELECTRIC POTENTIAL SENSOR

(75) Inventors: Takashi Ushijima, Yokohama (JP); Yoshikatsu Ichimura, Tokyo (JP); Atsushi Kandori, Ebina (JP); Yoshitaka Zaitsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/148,277

(22) Filed: Jun. 9, 2005

(65) Prior Publication Data

US 2006/0008284 A1 Jan. 12, 2006

(30) Foreign Application Priority Data

Jun. 15, 2004 (JP) ............................ 2004-177596

(51) Int. Cl.
*G03G 15/00* (2006.01)
*G01R 29/12* (2006.01)

(52) U.S. Cl. ........................................ 399/48; 324/458

(58) Field of Classification Search .................. 399/48
See application file for complete search history.

(56) References Cited

U.S. PATENT DOCUMENTS

| | | | | |
|---|---|---|---|---|
| 3,013,203 | A | 12/1961 | Allen et al. | 324/32 |
| 3,852,667 | A | 12/1974 | Williams et al. | 324/72 |
| 4,261,660 | A | 4/1981 | Suzuki et al. | 355/14 |
| 4,367,948 | A | 1/1983 | Suzuki | 355/14 |
| 4,683,436 | A | 7/1987 | Suzuki | 324/458 |
| 4,720,682 | A | 1/1988 | Ikushima et al. | 324/458 |
| 5,585,730 | A | 12/1996 | Pazda et al. | 324/452 |
| 6,177,800 | B1 | 1/2001 | Kubby et al. | 324/458 |
| 6,628,916 | B1 * | 9/2003 | Yasui et al. | 399/329 |

FOREIGN PATENT DOCUMENTS

| | | |
|---|---|---|
| JP | 2000-147035 | 5/2000 |

OTHER PUBLICATIONS

D.P. Loconto and R.S. Muller, "High-Sensitivity Micromechanical Electrostatic Voltmeter", The 7th International Conference on Solid-State Sensors and Actuators, pp. 878-881.

* cited by examiner

*Primary Examiner*—Vincent Q. Nguyen
(74) *Attorney, Agent, or Firm*—Fitzpatrick, Cella, Harper & Scinto

(57) ABSTRACT

An electric potential sensor includes a detecting electrode, a capacitor modulating unit for modulating a coupling capacitance between the detecting electrode and a measurement object by using an electrostatic force, and a shielding unit for electrically shielding the detecting electrode from electric fields due to the electrostatic force of the capacitor modulating unit. An electric potential of the measurement object is measured based on a change caused by the capacitor modulating unit in the amount of electrical charge induced in the detecting electrode. Entrance of lines of electric force due to the electrostatic force of the capacity modulating unit into the detecting electrode is prevented or reduced, so that an unfavorable mixture of driving noise into an output signal of the detecting electrode can be prevented or reduced.

12 Claims, 11 Drawing Sheets

ELECTRIC POTENTIAL SENSOR

BACKGROUND OF THE INVENTION

1. Field of the Invention

The present invention relates to a non-contacting electric potential sensor capable of measuring an electric potential of an object to be measured (a measurement object) based on the amount of electrical charge induced in a detecting electrode, and apparatuses, such as an image forming apparatus, using the electric potential sensor.

2. Description of the Related Background Art

Conventionally, there exists technology according to which a shutter disposed between a measurement object and a detecting electrode is driven to change the amount of electrical charge induced in the detecting electrode, and a surface electric potential of the measurement object is measured based on a change in the amount of electrical charge (see Solid-State Sensors and Actuators (The 7th International Conference) pp. 878–881). In such technology, the shutter is driven in a vacuum to achieve a low-voltage drive of the shutter, and driving noise is hence reduced by this low-voltage drive. The driving noise results from fields that are generated by a driver for driving the shutter and that reach the detecting electrode.

Further, there has been proposed another technology according to which a plurality of sets of a shutter and a detecting electrode are arranged, and each shutter, disposed between a measurement object and each detecting electrode, is driven to change the amount of electrical charge induced in the detecting electrode, such that a surface electric potential of the measurement object can be measured based on the change in the amount of electrical charge (see Japanese Patent Application Laid-Open No. 2000-147035 (its U.S. counterpart is U.S. Pat. No. 6,177,800)).

With those conventional technologies, however, the following phenomenon is likely to occur. When a shutter is driven using an electrostatic force, it is possible that electric fields generated by a shutter driver reach a detecting electrode. In such a case, driving noise due to those electric fields is likely to mix with an output signal from the detecting electrode. The driving noise disadvantageously affects an accurate sensing, and reduces the sensitivity of a potential sensor.

SUMMARY OF THE INVENTION

It is an object of the present invention in view of the above-described disadvantages to provide an electric potential sensor which is to be used facing an object whose electric potential is to be measured (a measurement object).

According to one aspect of the present invention, there is provided an electric potential sensor which includes a detecting electrode, a capacitor modulating unit for modulating a coupling capacitance between the detecting electrode and a measurement object by using an electrostatic force, and an electric shielding unit for electrically shielding the detecting electrode from electric fields due to the electrostatic force of the capacitor modulating unit. In such a construction, an electric potential of the measurement object is measured based on a change in the amount of electrical charge induced in the detecting electrode by the capacitor modulating unit.

The capacitor modulating unit can be any type that is capable of modulating the coupling capacitance by using an electrostatic force. For example, the following mechanisms can be used: a modulating mechanism for modulating an effective area of a detecting electrode exposed to a measurement object, or a distance between a detecting electrode and a measurement object using a mechanical vibration caused by the electrostatic force; and a modulating mechanism for periodically changing a dielectric constant of an insulating material disposed between a detecting electrode and a measurement object by using the electrostatic force.

In an electric potential sensor of the present invention, entrance of lines of electric force (electric fields) due to the electrostatic force of the capacity modulating unit into the detecting electrode can be prevented or reduced, so that unfavorable mixing of driving noise into an output signal of the detecting electrode can be prevented or reduced.

These advantages, as well as others, will be more readily understood in connection with the following detailed description of the preferred embodiments and examples of the invention in connection with the drawings.

DESCRIPTION OF THE PREFERRED EMBODIMENTS

Embodiments of an electric potential sensor and an image forming apparatus of the present invention will hereinafter be described with reference to the drawings.

Figure 1A:
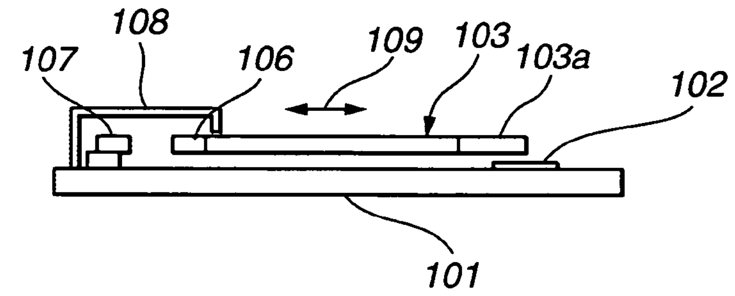
FIG. 1A is a cross-sectional view, taken along line 1A–1A' of FIG. 1B, illustrating a first embodiment of an electric potential sensor according to the present invention.
Figure 1B:
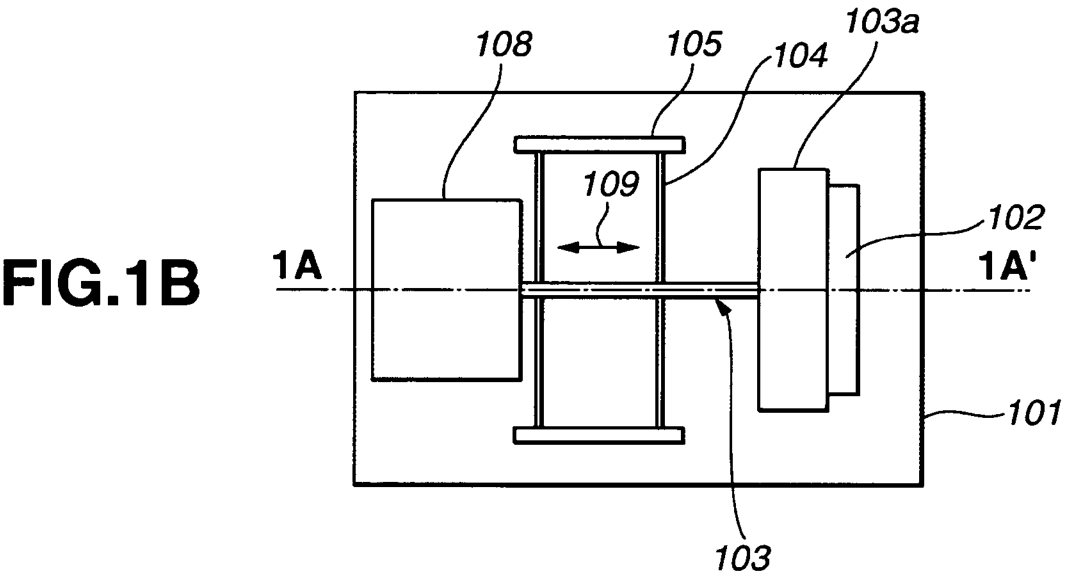
FIG. 1B is a plan view illustrating the first embodiment.
Figure 1C:
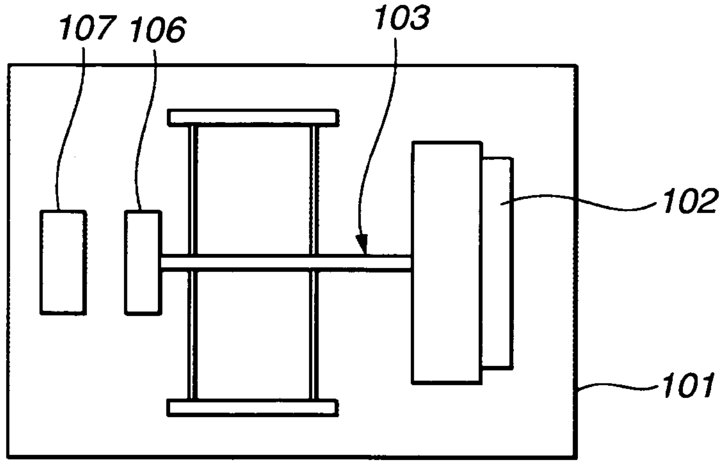
FIG. 1C is a plan view illustrating the first embodiment, which is depicted with an upper ceiling portion of an electric shield is removed.

A first embodiment directed to an electric potential sensor will be described with reference to FIGS. 1A to 1C. As illustrated in FIGS. 1A to 1C, the electric potential sensor of this embodiment includes a substrate 101, a detecting electrode 102 formed on the substrate 101, a shutter member 103, elastic beams 104, a pair of anchor members 105, a stationary electrode 107, and an electric shield 108. The shutter member 103 includes a movable electrode 106 formed at its one end and a shutter portion 103*a* formed at its other end. The shutter member 103 moves in such a reciprocal manner that the shutter portion 103*a* can variably cover the detecting electrode 102 to periodically change the electric field that reaches the detecting electrode 102 from a measurement object (not shown).

Each elastic beam 104 is connected to an intermediate portion of the shutter member 103 to permit the reciprocating motion of the shutter member 103. Each anchor member 105 is connected to outermost ends of the elastic beams 104, and fixed to the substrate 101 to achieve a stable reciprocating motion of the shutter member 103, as indicated by arrows 109. The stationary electrode 107 acts on the movable electrode 106 to move the movable electrode 106 by an electrostatic attractive force appearing therebetween. The electric shield 108 substantially surrounds the stationary electrode 107 and the movable electrode 106 to prevent or reduce leakage of the electric field from electrodes 106 and 107.

Figure 7A:
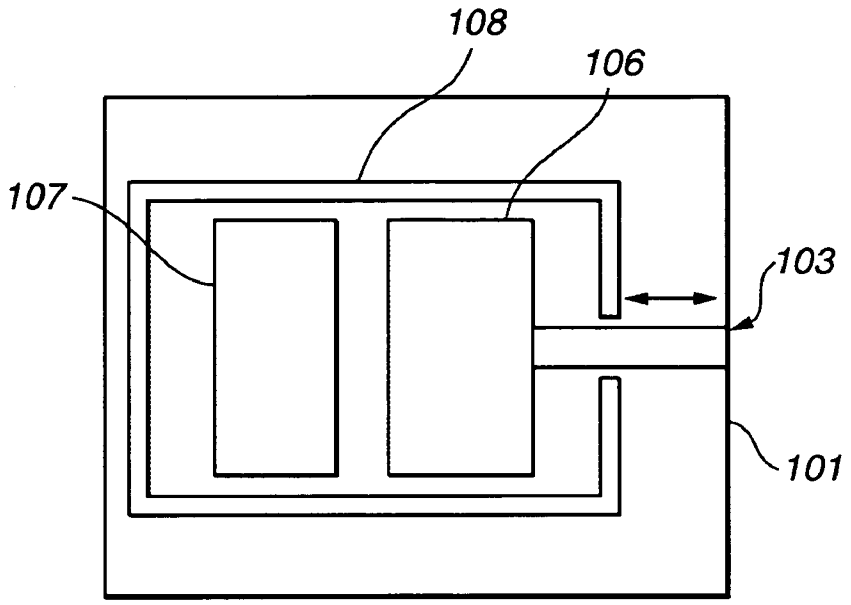
FIG. 7A is a plan view illustrating the first embodiment, which is depicted with an upper ceiling portion of an electric shield being removed.

In the first embodiment, the electric shield 108 is formed so as to substantially surround the stationary electrode 107 and the movable electrode 106 with respect to five sides out of six sides of upper and lower sides, right and left sides, and front and back sides, except a portion around the intermediate portion of the shutter member 103 (also see FIG. 7A). When the substrate 101 is formed of an electrically-conductive material, or when an electrically-conductive layer is formed on the substrate 101, almost all surrounding sides of a region around the stationary electrode 107 and the movable electrode 106 can be shielded in an electrostatic manner.

In the above-discussed first embodiment, a capacitor modulating means for modulating a coupling capacitance between the detecting electrode and the measurement object is comprised of the shutter portion 103*a* of the shutter member 103, and a shutter driver for driving the shutter portion 103*a*. The shutter driver includes the anchor members 105, the elastic beams 104, the movable electrode 106, the intermediate portion of the shutter member 103, and the stationary electrode 107.

When the reciprocating motion of the shutter member 103 is to be performed, an electrostatic force is generated between the movable electrode 106 and the stationary electrode 107 to move the shutter member 103 in the moving directions 109 as illustrated in FIGS. 1A and 1B. The stroke of the reciprocating motion can be controlled by increasing or decreasing the electrostatic force.

Figure 2A:
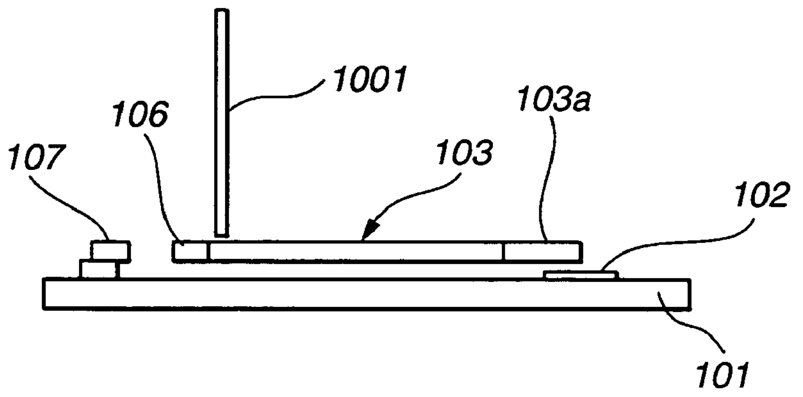
FIG. 2A is a cross-sectional view, taken along line 2A–2A' of FIG. 2B, illustrating a modified version of the first embodiment.
Figure 2B:
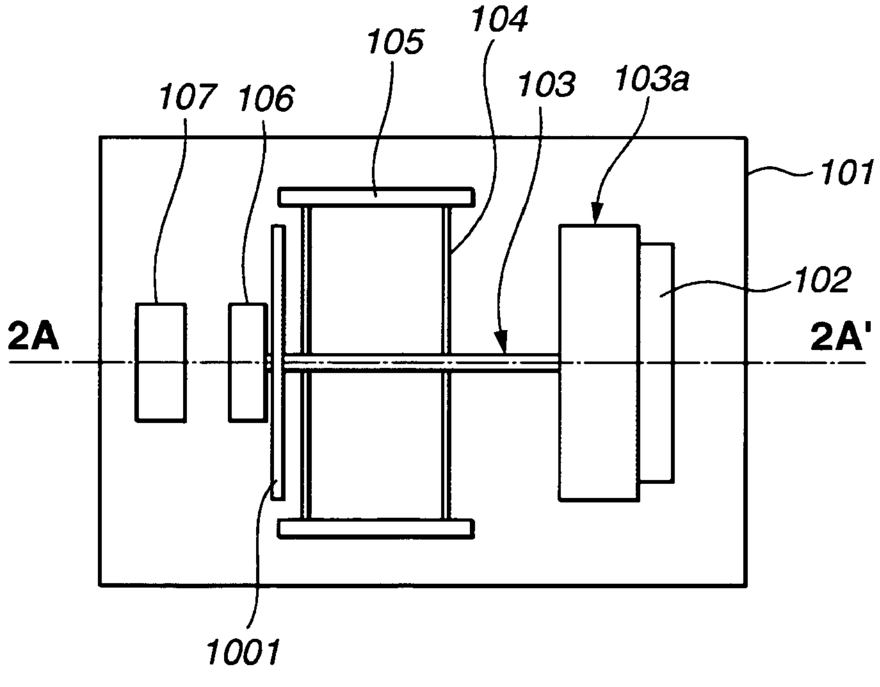
FIG. 2B is a plan view illustrating the modified version of the first embodiment.

In the structure described above, the electric shield 108 surrounds the stationary electrode 107 and the movable electrode 106. In other embodiments, an electric shield can also cover a region of the beams 104. Further, as illustrated in FIGS. 2A and 2B, an electric shield 1001 can have a wall-like configuration that straddles the intermediate portion of the shutter member 103 and is fixed to the substrate 101. In this case, height and width of the wall-like electric shield 1001 are appropriately designed to prevent or reduce leakage of the electric field considering a driving voltage of the driver, and the like.

Figure 3A:
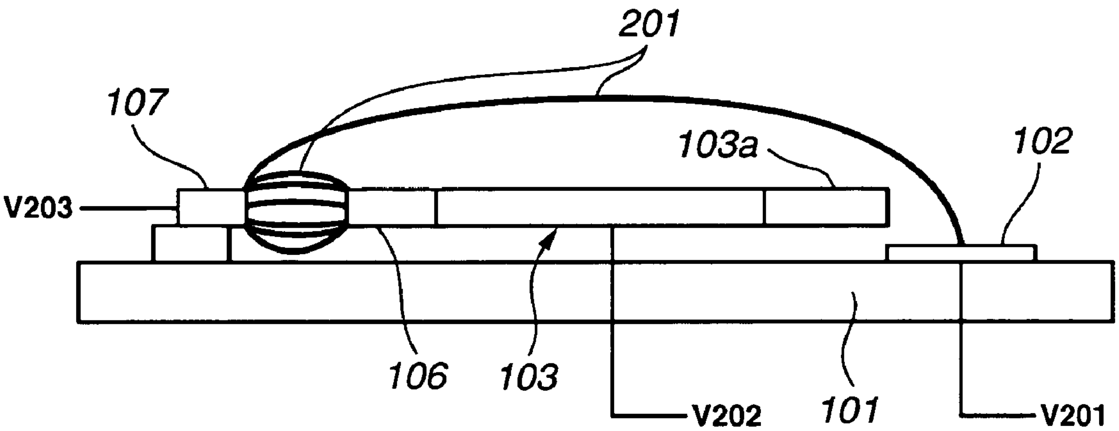
FIG. 3A is a cross-sectional view illustrating a distribution of lines of electric force between a movable electrode, a stationary electrode, and a detecting electrode in a structure without an electric shield.
Figure 3B:
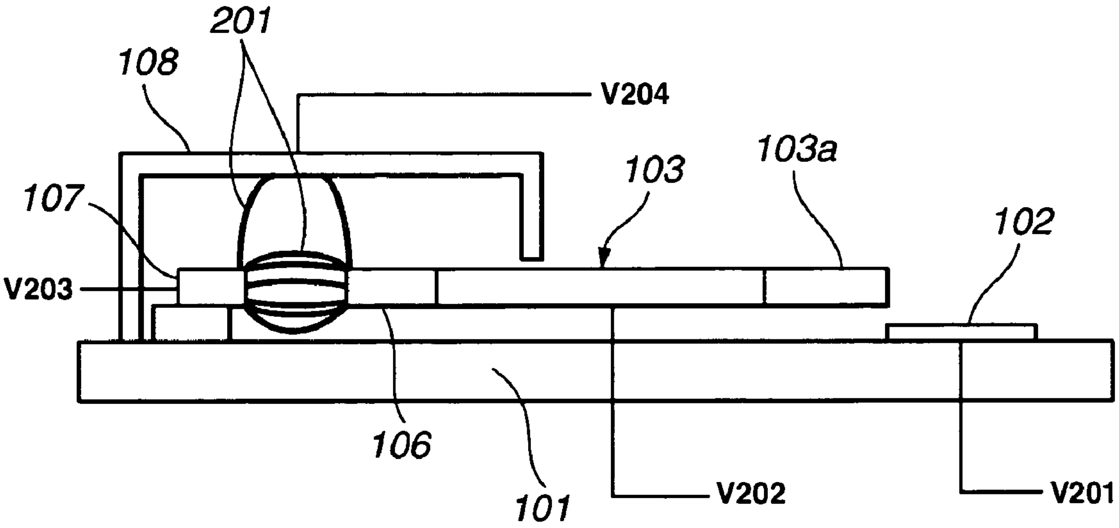
FIG. 3B is a cross-sectional view illustrating a distribution of lines of electric force between a movable electrode, a stationary electrode, and a detecting electrode in a structure equipped with an electric shield.

The function of the electric shield 108 will now be described with reference to FIGS. 3A and 3B. In FIGS. 3A and 3B, the distribution of electric fields between the movable electrode 106, the stationary electrode 107, and the detecting electrode 102 is schematically shown by lines of electric force. Reference characters V201 to V204 designate an electric potential of the detecting electrode 102 relative to a ground (GND) potential (0 V), an electric potential of the shutter member 103 relative to a ground (GND) potential (0 V), an electric potential of the stationary electrode 107 relative to a ground (GND) potential (0 V), and an electric potential of the electric shield 108 relative to a ground (GND) potential (0 V), respectively.

In the structure depicted in FIGS. 3A and 3B, the relationships between the potentials are represented by |V203|>|V202| and |V203|>|V201|. In other words, the potential of the stationary electrode 107 has an absolute value greater than each of the potential of the detecting electrode 102 and the potential of the shutter member 103. Therefore, when the structure lacks the electric shield 108, as illustrated in FIG. 3A, lines 201 of electric force (i.e., a driving force for the movable electrode 106) appear between the stationary electrode 107 and the movable electrode 106, and lines 201 of electric force extend between the stationary electrode 107 and the detecting electrode 102. The lines 201 of electric force that extend to the detecting electrode 102 cause the driving noise in the detecting electrode 102, as discussed above.

In the structure of the first embodiment illustrated in FIG. 3B, the electric shield 108 prevents or reduces the extension of the lines 201 of electric force from the stationary electrode 107 to the detecting electrode 102. Here, it is preferable that V201=V204. Otherwise, the electric shield 108 and the detecting electrode 102 can act as a capacitor if V201≠V204, and the amount of electrical charge in this capacitor can vary (i.e., noise occurs) if the location of the shutter member 103 changes between the electric shield 108 and the detecting electrode 102.

Further, it is preferable that V201=V202. Otherwise, the shutter member 103 and the detecting electrode 102 can act as a capacitor if V201≠V202, and the amount of electrical charge in this capacitor can vary (i.e., noise occurs) if the location of the shutter member 103 changes relative to the detecting electrode 102.

It is desirable that a material of the substrate 101 or a material (not shown) covering a surface of the substrate 101 is electrically conductive, and that the substrate 101 (or the material covering the surface of the substrate 101), the driver (i.e., the movable electrode 106 and the stationary electrode 107), and the detecting electrode 102 are electrically insulated from each other.

Further, the potential of the substrate 101 (or the material covering the surface of the substrate 101) is desirably set equal to V201. This arrangement aids in electrically shielding the detecting electrode 102 almost entirely from a space containing the movable electrode 106 and the stationary electrode 107. Thus, lines of electric force generated between the movable electrode 106 and the stationary electrode 107 can be reduced or prevented from reaching the detecting electrode 102. Consequently, occurrences of noise in the detecting electrode 102 can be prevented or reduced.

Figure 4A:
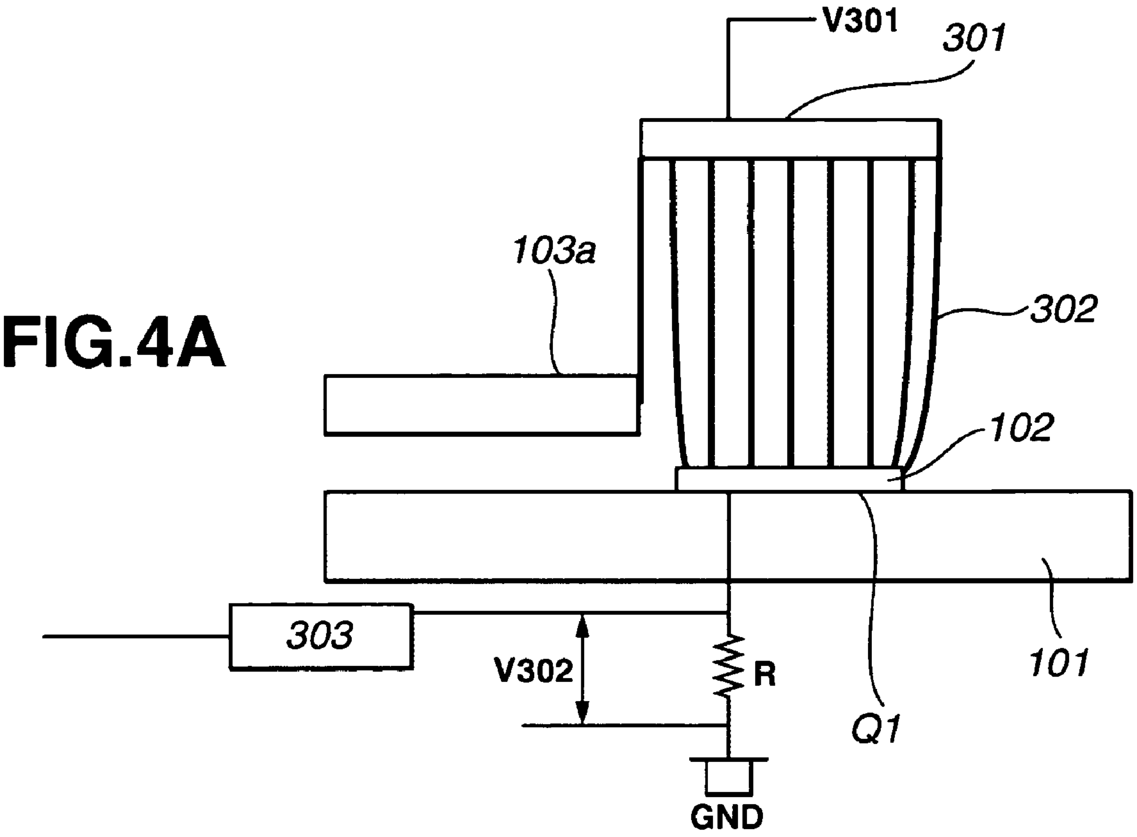
FIGS. 4A and 4B are cross-sectional views showing the principle of measuring an electric potential V301 of a measuring object.
Figure 4B:
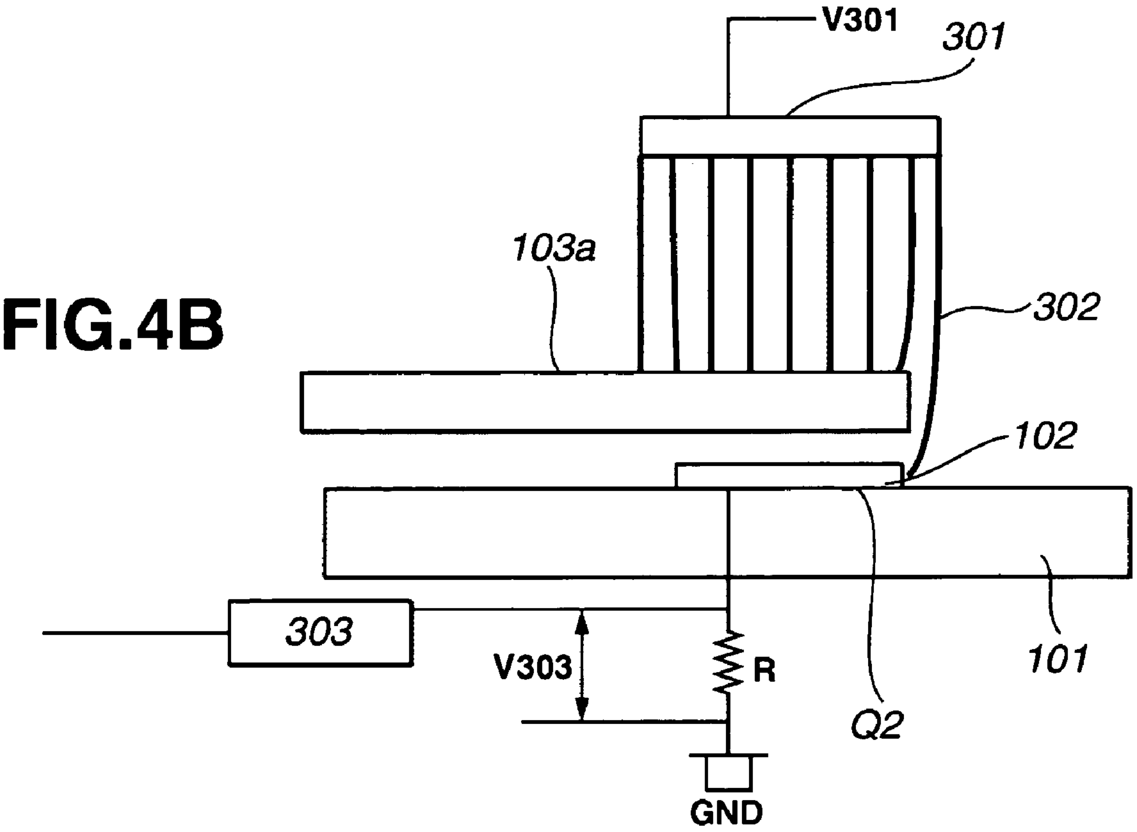

The principle of measuring an electric potential V301 of a measurement object 301 relative to a GND potential will now be described with reference to FIGS. 4A and 4B. In FIG. 4A, the shutter portion 103*a* takes a first position in which the detecting electrode 102 is exposed to the measurement object 301. In FIG. 4B, the shutter portion 103*a* takes a second position in which at least a portion of the detecting electrode 102 is covered with the shutter portion 103*a* relative to the measurement object 301. Here, reference character V302 designates an electric potential of the detecting electrode 102 in the first position relative to a GND potential, and reference character V303 designates an electric potential of the detecting electrode 102 in the second position relative to a GND potential.

In the structure illustrated in FIGS. 4A and 4B, V301≠V302 and V301≠V303. When the shutter portion 103*a* is moved between the first position and the second position, a distribution of lines 302 of electric force between the measurement object 301 and the detecting electrode 102 changes as illustrated in FIGS. 4A and 4B. Thus, the movement of the shutter portion 103*a* modulates a coupling capacitance between the detecting electrode 102 and the measurement object 301. Upon change in the lines 302 of electric force, the amount of electrical charge induced in the detecting electrode 102 varies.

Where Q1 is the amount of electrical charge induced in the detecting electrode 102 at the time the shutter portion 103*a* takes the first position (most lines of electric force from the measurement object 301 reach the detecting electrode 102) and Q2 is the amount of electrical charge induced in the detecting electrode 102 at the time the shutter portion 103*a* takes the second position (least lines of electric force from the measurement object 301 reach the detecting electrode 102), ΔQ, which is defined by ΔQ=Q1−Q2, is a value determined by an electric potential of the measurement object 301.

When the reciprocating motion of the shutter portion 103*a* is executed in a sinusoidal-wave manner, the potential V301 of the measurement object 301 can be obtained by the following formula:

$$V301=I(t)\cdot R$$

where I(t)=dQ(t)/dt, Q(t)=ΔQ/2·sin(2nft), dQ(t)/dt=2nf ·ΔQ/2·cos(2nft), f is the driving frequency of the shutter portion 103*a*, R is the term (resistance) of current-voltage conversion (R is shown in FIGS. 4A and 4B). Accordingly, an output voltage (V302 or V303) corresponding to V301 increases as ΔQ increases. The sensitivity of an electric potential sensor is enhanced as the output voltage increases. Further, the above-discussed noise can be relatively reduced.

A signal processing device 303 detects the output voltage of V302 or V303 and infers the corresponding value of V301.

In the first embodiment including the electric shield as discussed above, the driving noise can be eliminated or reduced without requiring vacuum packaging and an increase in the size of the sensor.

A detailed description thereof is as follows. In general, the following methods can be considered as means for reducing the driving noise.

(1) One method is a method of lowering the driving voltage. In connection with such a method, there exist a method in which a potential sensor is packaged in a vacuum to decrease resistance by air, such that a voltage for driving a shutter can be lowered, and a method in which a beam acting as a shutter is designed to be readily flexed, such that a voltage for driving the shutter can be lowered.

(2) Another method is a method of arranging a driver away from a detecting electrode.

These methods (1) and (2), however, have disadvantages. With the method (1), the potential sensor needs to be packaged in a vacuum. Complex packaging techniques and a costly vacuum apparatus are required to package the potential sensor in such a manner. Further, it is difficult to maintain a vacuum condition of the device. Additionally, the size of the potential sensor fabricated by the method (1) is likely to increase. When the shutter is driven using resonance in such a sensor, its resonance frequency and its output are likely to decrease.

With the method (2), the size of the potential sensor fabricated thereby is likely to increase. In contrast to these disadvantageous methods, the first embodiment is advantageous as discussed above.

Further, in the first embodiment, in particular, in a structure where the electric shield is provided surrounding the driver as illustrated in FIGS. 1A and 1B, a change in the driving characteristic and a phenomenon of short circuit due to adherence of particles to the driver can be prevented as discussed below. Electric fields are generated from the driver. Accordingly, when charged particles, such as toner and dust, are present around the electric fields, these particles are attracted and adhered to the driver. Those adhered particles change the driving characteristic of the shutter, and possibly cause the short circuit of the driver. Further, it is possible that particles other than the charged particles are also adhered to the driver, and cause the above-described unfavorable conditions.

Furthermore, since the first embodiment can be fabricated using a semiconductor process (see a fabrication example described later), an electric potential sensor with a micro-sized shutter can be mass-produced at reduced costs.

Figure 5:
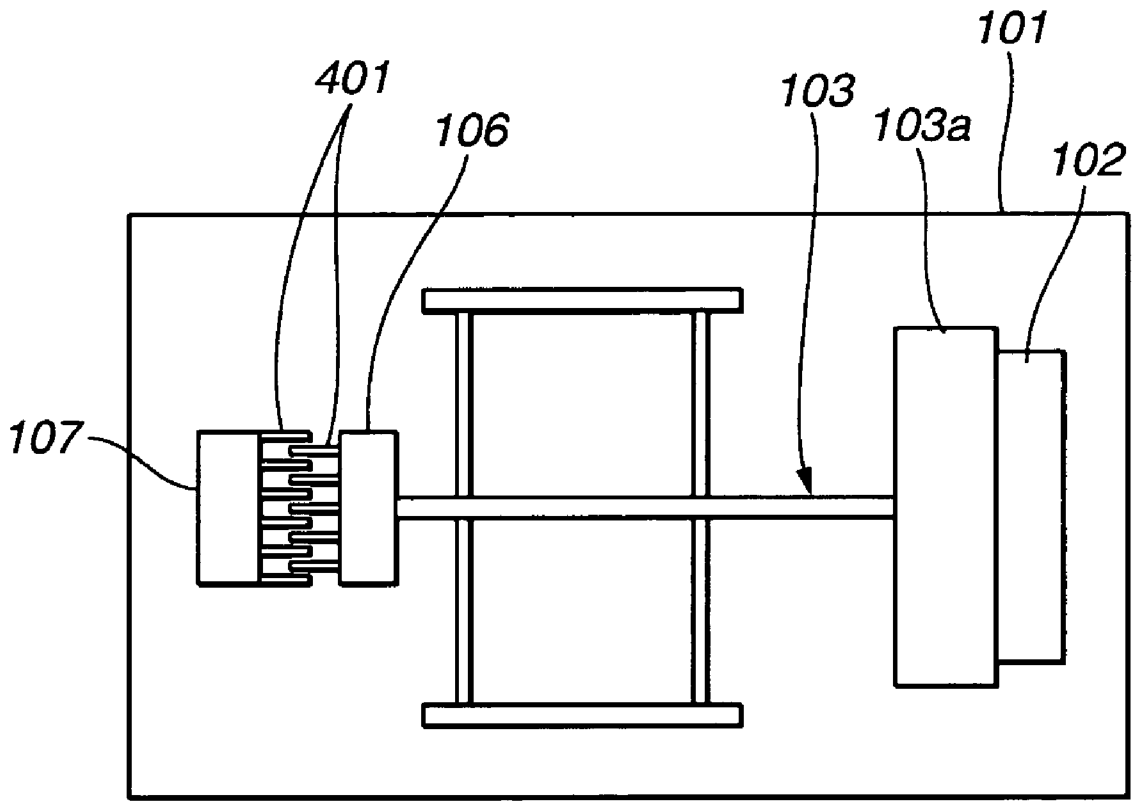
FIG. 5 is a plan view illustrating a second embodiment of an electric potential sensor according to the present invention, which includes an electrostatic force generating portion with comb type electrodes depicted with an electric shield being removed.

A second embodiment directed to an electric potential sensor will now be described with reference to FIG. 5. An electric shield disposed as illustrated in FIGS. 1A and 1B, or FIGS. 2A and 2B is omitted from FIG. 5 for the purpose of illustration to clearly show a driver portion of the second embodiment. As illustrated in FIG. 5, a stationary electrode 107 and a movable electrode 106 are equipped with comb type electrodes 401. In such a structure, a displacement amount of the shutter member 103 and a force for moving the shutter member 103 can be increased, as compared with a structure lacking the comb type electrodes 401.

In the structure lacking the comb type electrodes, the movable electrode 106 can be pulled toward the stationary electrode 107 with less displacement than the structure with the comb type electrodes. However, when pulled toward the stationary electrode 107, the movable electrode 106 might be brought into contact with the stationary electrode 107. In this case, electric discharge may occur under some conditions of the driving voltage, or the like. The potential sensor might be broken by the electric discharge. The second embodiment helps protect against such phenomenon. As for other points, the second embodiment is substantially the same as the first embodiment.

Figure 6:
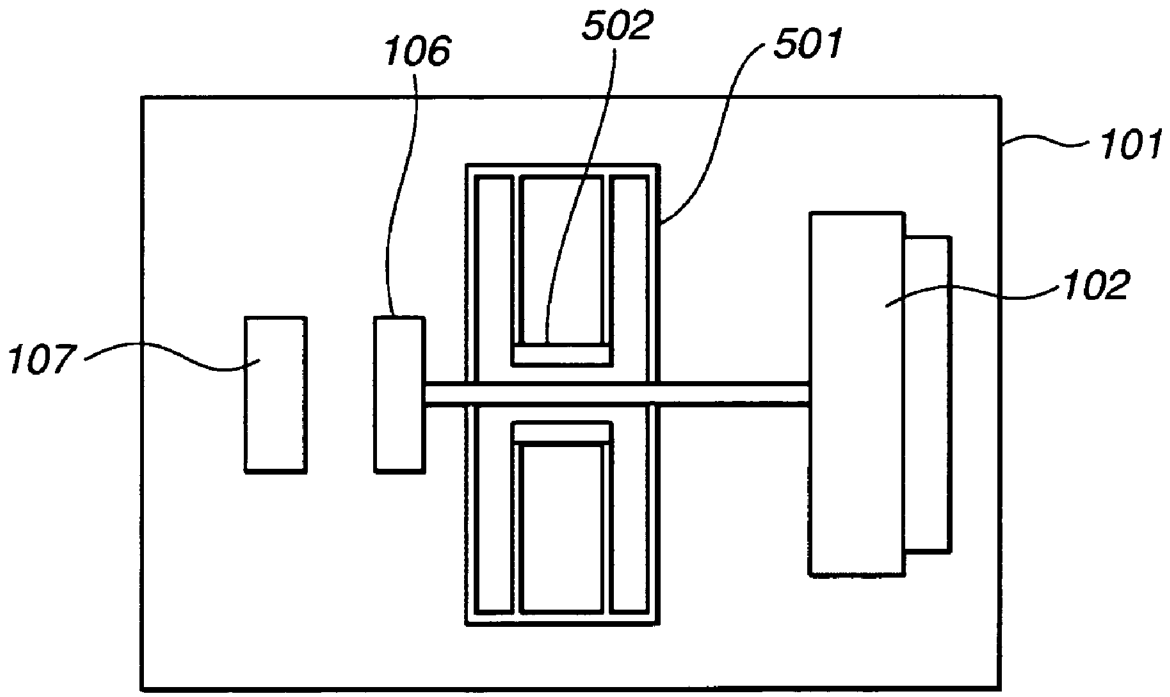
FIG. 6 is a plan view illustrating a third embodiment of an electric potential sensor according to the present invention, which includes a shutter member with a folded beam structure, and is depicted with an electric shield being removed.

A third embodiment directed to an electric potential sensor will now be described with reference to FIG. 6. An electric shield disposed as illustrated in FIGS. 1A and 1B, or FIGS. 2A and 2B is omitted from FIG. 6 for the purpose of illustration to clearly show a driver portion of the third embodiment. In the third embodiment, a beam 501 for connecting an intermediate portion of the shutter member 103 to an anchor 502, which is connected to substrate 101, is shaped into a folded pattern as illustrated in FIG. 6. Accordingly, stresses occurring at the times of fabricating the beam and driving the shutter member 103 can be reduced. Durability of a potential sensor can hence be enhanced. Further, a beam having a given length can be used in a more compact form since the beam is used in a folded shape, so that the size of a potential sensor can be decreased. As for other points, the third embodiment is substantially the same as the first embodiment.

A fourth embodiment directed to an electric potential sensor will now be described with reference to FIGS. 7B and 7C. For comparison, FIG. 7A illustrates an electric shield 108 of the first embodiment with a flat ceiling portion of the electric shield 108 parallel to the substrate 101 being removed for the purpose of illustration. As illustrated in FIG. 7A, four sides around the movable electrode 106 and the stationary electrode 107 are substantially surrounded by the electric shield 108.

Figure 7B:
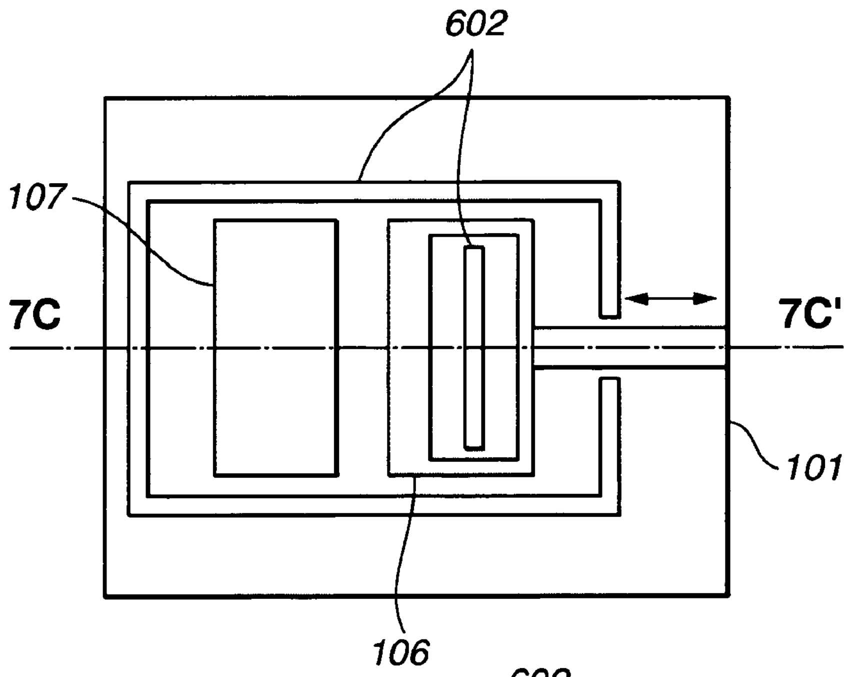
FIG. 7B is a plan view illustrating a fourth embodiment of an electric potential sensor according to the present invention, which is depicted with an upper ceiling portion of an electric shield being removed.
Figure 7C:
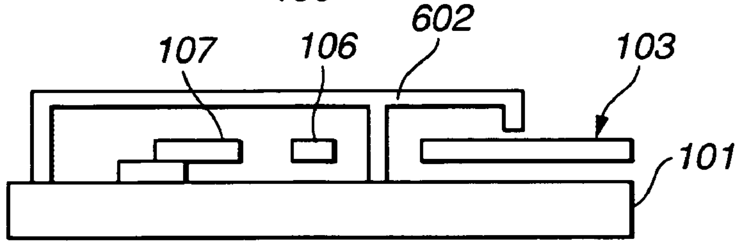
FIG. 7C is a cross-sectional view, taken along line 7C–7C' of FIG. 7B, illustrating the fourth embodiment.

In contrast to the structure of FIG. 7A, an electric shield 602 in the fourth embodiment has a configuration as illustrated in FIGS. 7B and 7C. In the structure illustrated in FIGS. 7B and 7C, the electric shield 602 has a double wall as viewed from an electrostatic force generating portion (i.e., a portion including the stationary electrode 107 and the movable electrode 106) toward the detecting electrode 102. Thus, lines of electric force from the above electrostatic force generating portion can be more effectively shielded. Hence, entrance of the lines of electric force into the detecting electrode 102 from the above portion can be more effectively reduced. As for other points, the fourth embodiment is substantially the same as the first embodiment.

Figure 8:
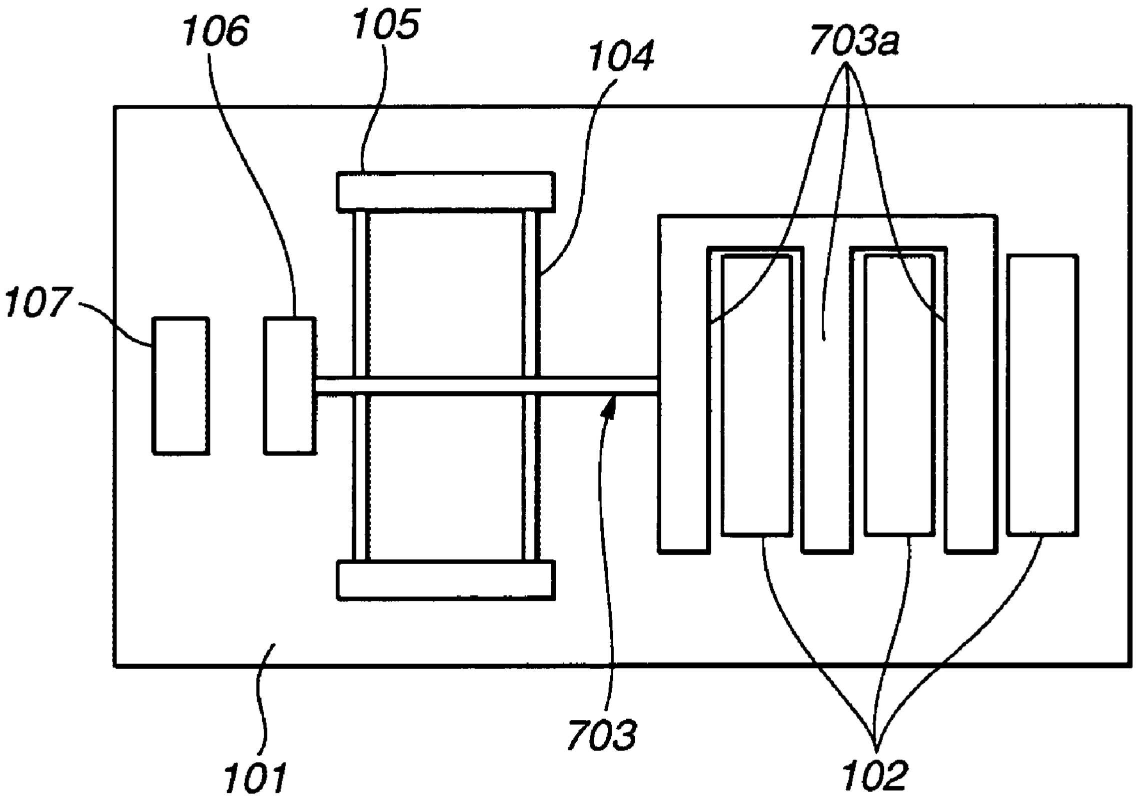
FIG. 8 is a plan view illustrating a fifth embodiment of an electric potential sensor according to the present invention, which includes three sets of a shutter and a detecting electrode, and is depicted with an electric shield being removed.

A fifth embodiment directed to an electric potential sensor will now be described with reference to FIG. 8. An electric shield disposed as illustrated in FIGS. 1A and 1B, or FIGS. 2A and 2B is omitted from FIG. 8 for the purpose of illustration to clearly show a driver portion of the fifth embodiment. In the fifth embodiment, a shutter member 703 has a plurality of shutter portions 703*a* (in this case three shutter portions 703*a*), and a plurality of detecting electrodes 102 (in this case three detecting electrodes 102) are disposed, as illustrated in FIG. 8. In proportional to the number of sets of the shutter portion 703*a* and the detecting electrode 102, an output signal obtained from the detecting electrodes 102 can be increased. Accordingly, various noises can be relatively reduced in fifth embodiment.

As referred to in the first embodiment, when a material of the substrate 101 is electrically conductive in each embodiment, entrance of lines of electric force into the detecting electrode 102 through a side of the substrate 101 can be reduced or prevented by making a potential of the substrate 101 equal to that of the electric shield. Where the substrate 101 is formed of an insulating material, such entrance of lines of electric force into the detecting electrode 102 can be reduced or prevented by fabricating a structure, in which a conductive layer is formed on a surface of the substrate 101 under a portion including the electrostatic force generating mechanism, and the conductive layer is electrically connected to the electric shield.

Figure 9A:
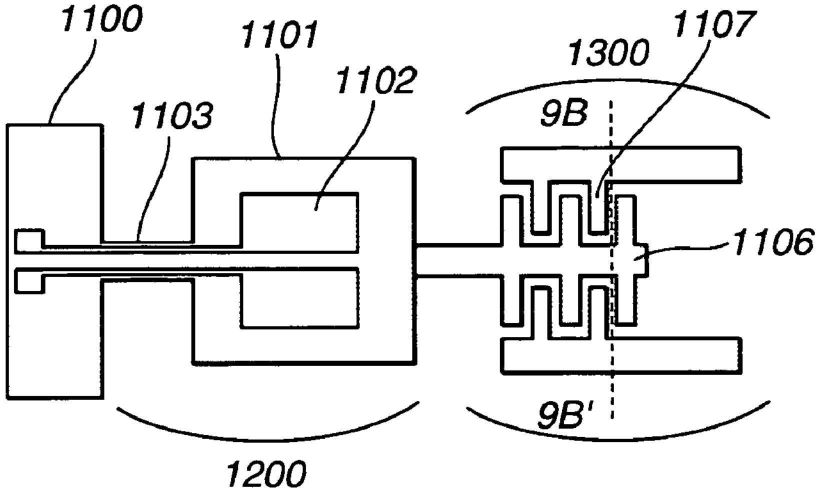
FIG. 9A is a plan view illustrating a sixth embodiment of an electric potential sensor according to the present invention, which includes a swingingly-rotatable member for supporting detecting electrodes, and is depicted with an electric shield being removed.
Figure 9B:
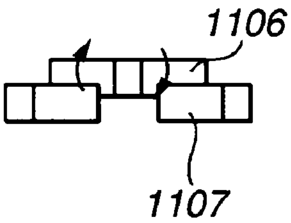
FIG. 9B is a cross-sectional view, taken along line 9B–9B' of FIG. 9A, illustrating the sixth embodiment.
Figure 9C:
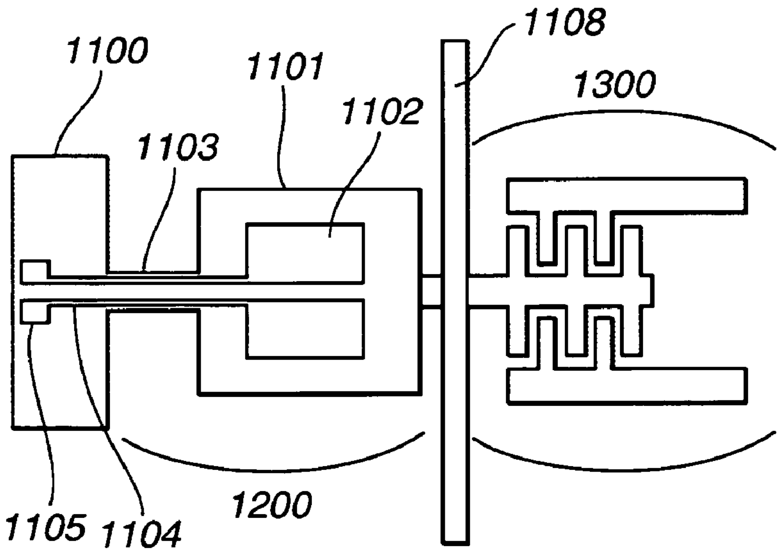
FIG. 9C is a plan view illustrating the sixth embodiment.

A sixth embodiment directed to an electric potential sensor will now be described with reference to FIGS. 9A, 9B and 9C. In FIGS. 9A and 9B, an electric shield 1108 illustrated in FIG. 9C is omitted for clarity. In the sixth embodiment, a beam 1103 extends from a support portion 1100, a planar swingingly-rotatable member 1101 is formed integrally with the beam 1103, and a shaft portion extends from the swingingly-rotatable member 1101, as illustrated in FIG. 9A.

On opposite sides of the shaft portion, comb type movable electrodes 1106 are formed. Facing each comb type movable electrode 1106, a comb type stationary electrode 1107 is provided. Under a control of interaction of DC-like electrostatic force between the comb type movable electrode 1106 and the comb type stationary electrode 1107, the swingingly-rotatable member 1101 is swingingly rotated about a center axis defined by the beam 1103 and the shaft portion, as illustrated in FIG. 9B.

On a surface of the swingingly-rotatable member 1101, two planar detecting electrodes 1102 are disposed symmetrically with respect to a line of the center axis of the swingingly-rotatable member 1101. The detecting electrodes 1102 are electrically connected to an external signal processing circuit (not shown) through electric wires 1104 and pull-out electrodes 1105.

In the structure of the above-discussed sixth embodiment, upon swinging rotation of the swingingly-rotatable member 1101, distances between the two detecting electrodes 1102 and a measurement object (not shown) change in a mutually-opposite phase. Accordingly, coupling capacitances between the two detecting electrodes 1102 and the measurement object periodically change in a mutually-opposite phase. An electric potential of the measurement object can be measured by processing output signals from the two detecting electrodes 1102 in a differential manner in the signal processing circuit. The number of detecting electrodes is not necessarily limited to two. Function of a potential sensor can be likewise achieved when only one detecting electrode is used.

In the structure of FIG. 9A, however, lines of electric force from an electrostatic force generation portion 1300 reach a region 1200 of the detecting electrode 1102, generating driving noise. In the sixth embodiment, therefore, an electric shield 1108 is disposed at a boundary between the electrostatic force generation portion 1300 and the region 1200 of the detecting electrodes 1102, except a space around the shaft portion, as illustrated in FIG. 9C.

The electric shield 1108 electrically shields the region 1200 containing the detecting electrodes 1102 from the electrostatic force generation portion 1300, such that entrance of the lines of electric force from the electrostatic force generation portion 1300 into the detecting electrodes 1102 can be prevented or reduced. The driving noise can hence be reduced or eliminated.

Figure 10:
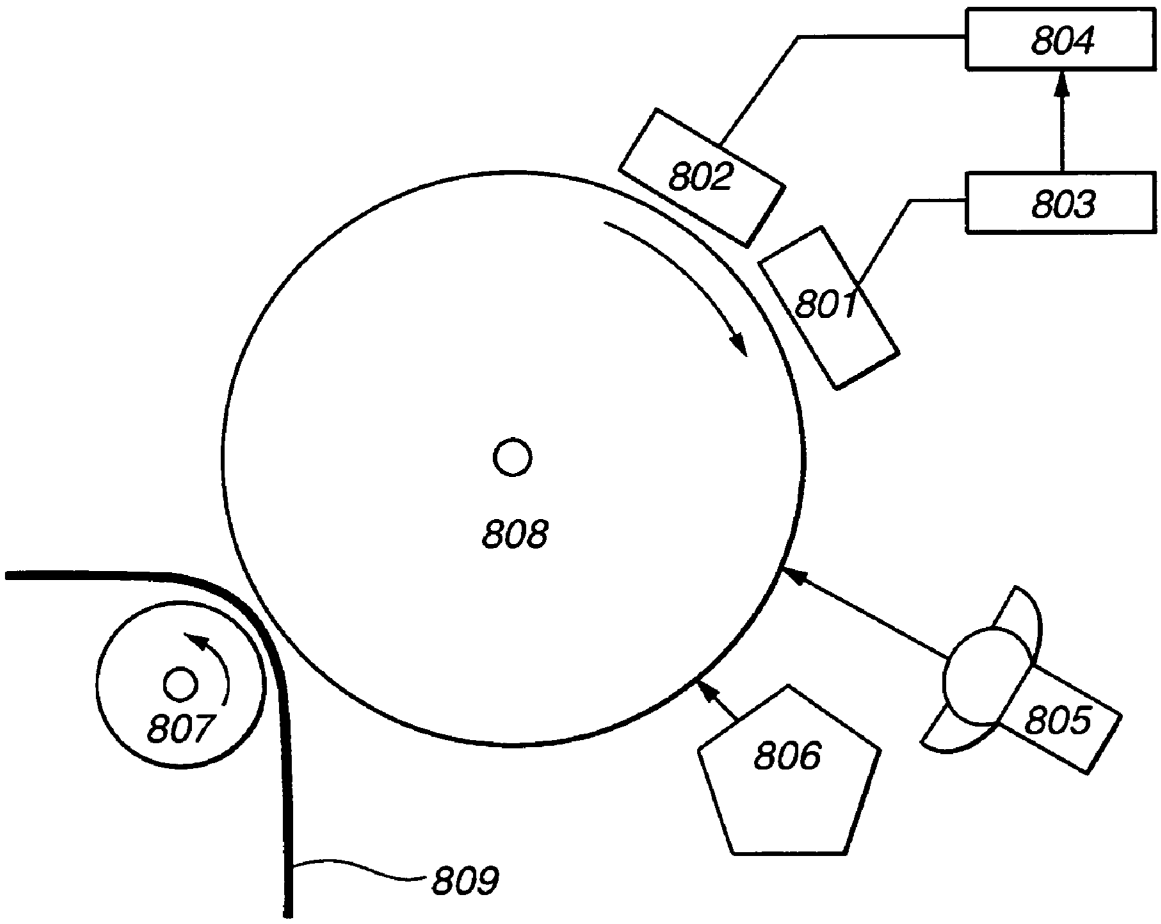
FIG. 10 is a view schematically illustrating a seventh embodiment of an image forming apparatus according to the present invention.

Description will now be given for an image forming apparatus of a seventh embodiment using an electric potential sensor of the present invention, with reference to FIG. 10. In FIG. 10, reference numeral 801 designates an electric potential sensor of the present invention. Reference numeral 802 designates an electrostatic charging device. Reference numeral 803 designates a signal processing device. Reference numeral 804 designates a high-voltage generating device. Reference numeral 805 designates a light exposing device. Reference numeral 806 designates a toner supplying device. Reference numeral 807 designates a transferring material conveying roller. Reference numeral 808 designates a photosensitive drum. Reference numeral 809 designates a transferring material sandwiched between the transferring material conveying roller 807 and the photosensitive drum 808.

An electric potential distribution on the photosensitive drum 808 can be measured when an output of the potential sensor 801 is monitored in synchronism with the rotation of the photosensitive drum 808. Unevenness of an image can be reduced when the electrostatic charging device 802 is controlled based on the thus-measured electric potential distribution.

As illustrated in FIG. 10, the electrostatic charging device 802, the electric potential sensor 801, the light exposing device 805, and the toner supplying device 806 are arranged around the photosensitive drum 808. The electrostatic charging device 802 electrifies a surface of the drum 808, and the surface of the drum 808 is exposed to light using the exposing device 805 to form a latent image on the drum 808. Toner is attached to the latent image by the toner supplying device 806 to obtain a toner image. The toner image is then transferred to the transferring material 809 sandwiched between the transferring material conveying roller 807 and the photosensitive drum 808, and the toner on the transferring material 809 is fixed. Thus, image formation is achieved.

In the above-discussed structure, a charged condition of the drum 808 is measured by the potential sensor 801 capable of outputting an accurate signal with reduced noises, its signal is processed by the signal processing device 803, and the electrostatic charging device 802 is controlled by feeding the processed signal back to the high-voltage generating device 804. Thus, a stable electrical charging of the drum 808 is achieved such that a stable image formation can be obtained.

Further, in an image forming apparatus using a potential sensor 801 of the present invention including an electric shield as illustrated in FIGS. 1A and 1B or the like, there is a reduced possibility that charged particles in the apparatus affect and degrade the operation of the potential sensor 801. Accordingly, a high-quality image can be formed based on accurate charging information (an output from the potential sensor 801) of the drum 808.

Description will now be given for an example of a method of fabricating an electric potential sensor of the present invention, with reference to FIGS. 11A to 11D.

Figures 11A, 11B, 11C, 11D:
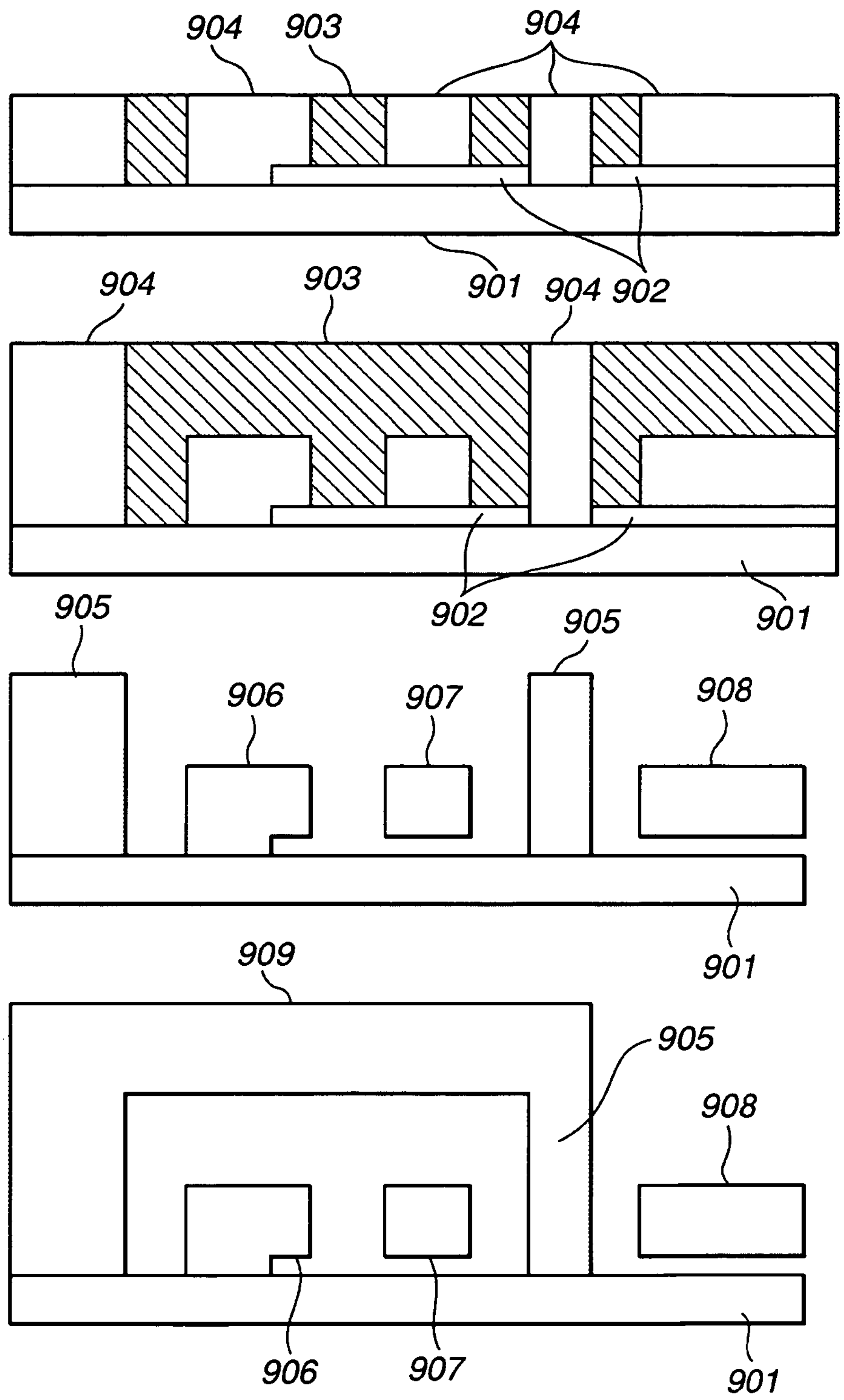
FIGS. 11A–11D are cross-sectional views illustrating an example of a fabrication method of fabricating an electric potential sensor according to the present invention.

In the fabrication method, electrodes for driving a shutter, a detecting electrode (not shown), electric wires for connecting these electrodes to a signal processing device (not shown), and the like are formed on a substrate 901 of $SiO_2$, using gold (Au), as illustrated in FIG. 11A. In this process step, the detecting electrode (not shown) and a sacrifice layer 902 of copper (Cu) for establishing a gap between the detecting electrode and the shutter are formed. Resin 903 is then patterned to form partition walls, and metal-plated portions 904 are formed using a plating method.

Further, additional resin 903 is patterned, and additional metal-plated portions 904 are formed, as illustrated in FIG. 11B. The resin 903 and sacrifice layer 9021 are then removed, as illustrated in FIG. 11C. Thus, side walls 905 of an electric shield, a stationary electrode 906, a movable electrode 907, and a shutter member 908 can be fabricated. An upper ceiling portion 909 of the electric shield is then placed on the side walls 905, as illustrated in FIG. 11D.

An electric potential sensor with an electric shield of the present invention can be fabricated by the process steps above. In the fabrication method, the upper ceiling portion 909 of the electric shield can also be formed by extending the metal plating process in FIG. 11B to bridge a gap between the side walls 905. In connection with the metal plating, nickel (Ni) electroplating, nickel (Ni) electroless plating, or the like can be employed. The plating is not limited to metal plating. Semiconductor or insulating material can also be plated. In the case of insulating material, an electrically-conductive layer is formed thereon at a place where conductivity is necessary. In this case, a metal piece can be used as the upper ceiling portion of the electric shield.

A similar configuration can be fabricated using silicon (Si) . An electric potential sensor formed of amorphous Si, polysilicon, or single crystal silicon can be fabricated, using, for example, PVD (physical vapor deposition) method, CVD (chemical vapor deposition) method, CMP (chemical mechanical polishing) method, dry etching method, or wet etching method. As a method other than vapor phase growth methods such as CVD method, there is a method according to which an Si substrate is subjected to DeepRIE to obtain a desired structure. Etched shapes with different heights, such as the sidewalls 905 of the electric shield and the stationary electrode 906, can also be formed by a method using a multi-stage etching mask. In this method, after a plurality of mask layers are formed, etching is performed to a desired depth, and additional etching is then performed using another mask, for example.

In the above fabrication method, the electric shield is fabricated simultaneously with the fabrication of the shutter portion and the like. In another method, it is possible to place a separately-formed metal shield on a region of the movable electrode and the stationary electrode after the fabrication of the shutter portion, etc., is completed.

Also in the potential sensor fabricated by the above fabrication method, the movable electrode and the stationary electrode are substantially surrounded by the electric shield, so that almost no electric fields due to the electrostatic force leaks outside the electric shield. Accordingly, driving noises can be substantially reduced or eliminated. Further, any particles, such as toner and dust, present near the electric potential sensor are less likely to be attracted by the movable electrode and the stationary electrode. Therefore, there is a reduced possibility of malfunction due to toner and dust infiltration.

Except as otherwise disclosed herein, the various individual components shown in outline or in block form in the figures are individually well-known, and their internal construction and operation are not critical either to the making or using of the present invention or to a description of the best mode of the invention.

While the present invention has been described with respect to what is presently considered to be the preferred embodiments and examples, it is to be understood that the invention is not limited to the disclosed embodiments and examples. The present invention is intended to cover various modifications and equivalent arrangements included within the spirit and the scope of the appended claims.

This application claims priority to Japanese Patent Application No. 2004-177596, filed Jun. 15, 2004, the contents of which are hereby incorporated by reference.

What is claimed is:

1. An electric potential sensor comprising:

a detecting electrode formed on a substrate, said detecting electrode being positionable facing a measurement object whose electric potential is to be measured based on a change in the amount of electrical charge induced in said detecting electrode;

capacitor modulating means, formed on the substrate, for modulating a coupling capacitance between said detecting electrode and the measurement object by using an electrostatic force; and electric shielding means, formed on the substrate, for electrically shielding said detecting electrode from electric fields due to the electrostatic force of said capacitor modulating means, wherein a potential of the substrate is set equal to a potential of said electric shielding means.

2. An electric potential sensor according to claim 1, wherein said capacitor modulating means includes a shutter that is movable between a first position where said shutter exposes said detecting electrode to the measurement object and a second position where said shutter covers at least a portion of said detecting electrode with respect to the measurement object, and a shutter driver for moving said shutter between the first position and the second position by using the electrostatic force.

3. An electric potential sensor according to claim 2, further comprising:

a folded beam structure, wherein the shutter and the substrate are connected by the folded beam structure.

4. An electric potential sensor according to claim 1, wherein said detecting electrode is disposed on a movable member, and said capacitor modulating means moves said movable member relative to the measurement object by using the electrostatic force, such that a distance between said detecting electrode and the measurement object is modulated.

5. An electric potential sensor according to claim 1, wherein said capacitor modulating means includes an electrostatic force generating portion which generates the electrostatic force, and said electric shielding means comprises an electric shielding member that is arranged to substantially surround at least said electrostatic force generating portion of said capacitor modulating means, wherein said detecting electrode is outside said electric shielding means.

6. An electric potential sensor according to claim 1, having a plurality of sets of said detecting electrode and said shutter.

7. An electric potential sensor according to claim 1, wherein said capacitor modulating means includes an electrostatic force generating portion which generates the electrostatic force, and said electric shielding means comprises an electric shielding member that is arranged in a wall configuration separating at least said electrostatic force generating portion of said capacitor modulating means from said detecting electrode.

8. An image forming apparatus comprising:

an electric potential sensor as recited in claim 1;

a signal processing device for processing an output signal from said electric potential sensor; and image forming means for forming an image, wherein a face, on which said detecting electrode is disposed, of said electric potential sensor is arranged facing a face of the measurement object, and said image forming means controls image formation on the face of the measurement object, based on an output of said signal processing device.

9. An electric potential sensor according to claim 1, wherein said electric shielding means further shields said detecting electrode from particles.

10. An electric potential sensor comprising:

a detecting electrode, said detecting electrode being positionable facing a measurement object whose electric potential is to be measured based on a change in the amount of electrical charge induced in said detecting electrode;

capacitor modulating means for modulating a coupling capacitance between said detecting electrode and the measurement object by using an electrostatic force; and electric shielding means for electrically shielding said detecting electrode from electric fields due to the electrostatic force of said capacitor modulating means, wherein said detecting electrode is disposed on a movable member, and said capacitor modulating means moves said movable member relative to the measurement object by using the electrostatic force, such that a distance between said detecting electrode and the measurement object is modulated.

11. An electric potential sensor according to claim 10, wherein said capacitor modulating means moves said movable member by rotating said movable member about a center axis.

12. An electric potential sensor according to claim 11, wherein said detecting electrode includes first and second detecting electrodes disposed on said movable member symmetrically with respect to the center axis, such that a distance between the first detecting electrode and the measurement object changes in an opposite phase to a distance between the second detecting electrode and the measurement object when said capacitor modulating means rotates said movable member.

* * * * *